(12) United States Patent
Stuart et al.

(10) Patent No.: US 10,636,573 B2
(45) Date of Patent: Apr. 28, 2020

(54) HIGH ENERGY DENSITY STORAGE DEVICE

(71) Applicants: Barbara Stuart, Altadena, CA (US); Stephen L Cunningham, Altadena, CA (US)

(72) Inventors: Martin A Stuart, Altadena, CA (US); Stephen L Cunningham, Altadena, CA (US)

(*) Notice: Subject to any disclaimer, the term of this patent is extended or adjusted under 35 U.S.C. 154(b) by 0 days.

(21) Appl. No.: 16/033,871

(22) Filed: Jul. 12, 2018

(65) Prior Publication Data
US 2018/0323012 A1 Nov. 8, 2018

Related U.S. Application Data

(63) Continuation of application No. 14/921,199, filed on Oct. 23, 2015, now Pat. No. 10,026,555, which is a
(Continued)

(51) Int. Cl.
*H01G 4/30* (2006.01)
*H01G 4/12* (2006.01)
(Continued)

(52) U.S. Cl.
CPC .......... *H01G 4/30* (2013.01); *H01G 4/012* (2013.01); *H01G 4/129* (2013.01);
(Continued)

(58) Field of Classification Search
CPC ............ H01G 4/30; H01G 4/018; H01G 4/06; H01G 4/1218; H01G 4/1272; H01G 4/129
See application file for complete search history.

(56) References Cited

U.S. PATENT DOCUMENTS

| 5,576,925 A | 11/1996 | Gorowitz et al. |
| 5,636,100 A | 6/1997 | Zheng et al. |

(Continued)

FOREIGN PATENT DOCUMENTS

| JP | S541918 B | 1/1979 |
| JP | S5434160 B1 | 10/1979 |

(Continued)

OTHER PUBLICATIONS

State Intellectual Property Office Search Report; Application No. 2012800560568; 1st Search; Date of Search Completion: Mar. 27, 2016.
(Continued)

*Primary Examiner* — Dion Ferguson
(74) *Attorney, Agent, or Firm* — Bodi Law LLC

(57) ABSTRACT

A device and its method of manufacture, the device configured for providing electrical energy storage of high specific energy density. The device contains one or more layers of high dielectric constant material, such as Barium Titanate or Hexagonal Barium Titanate, sandwiched between electrode layers made up of one or more of a variety of possible conducting materials. The device includes one or more electrically insulating layers including carbon, such as carbon formed into diamond or a diamond-like arrangement, for insulating the electrode(s) from the dielectric layer(s) to provide for very high breakdown voltages with good heat conductivity. The layers can be created by a variety of methods including laser deposition, and assembled to form a capacitor device provides the high energy density storage.

19 Claims, 7 Drawing Sheets

Related U.S. Application Data continuation of application No. 14/357,676, filed as application No. PCT/US2012/064944 on Nov. 14, 2012, now Pat. No. 9,230,741.

(60) Provisional application No. 61/560,461, filed on Nov. 16, 2011.

(51) Int. Cl.
*H01L 49/02* (2006.01)
*H01G 4/012* (2006.01)
*H01G 4/258* (2006.01)
*H01G 4/018* (2006.01)

(52) U.S. Cl.
CPC ......... *H01G 4/1218* (2013.01); *H01G 4/1227* (2013.01); *H01G 4/1272* (2013.01); *H01G 4/258* (2013.01); *H01L 28/55* (2013.01); *H01L 28/56* (2013.01); *H01G 4/018* (2013.01); *Y02T 10/7022* (2013.01)

(56) References Cited

U.S. PATENT DOCUMENTS

| | | | |
|---|---|---|---|
| 5,638,251 A | | 6/1997 | Goel et al. |
| 5,774,326 A | | 6/1998 | McConnelee et al. |
| 5,790,368 A | | 8/1998 | Naito et al. |
| 5,844,770 A | * | 12/1998 | Fries-Carr ............... H01G 4/32 361/301.5 |
| 5,926,359 A | | 7/1999 | Greco et al. |
| 7,023,089 B1 | | 4/2006 | Lu |
| 7,023,687 B2 | | 4/2006 | Sterzel et al. |
| 7,990,679 B2 | | 8/2011 | Ehrenberg et al. |
| 8,097,557 B2 | | 1/2012 | Bhise et al. |
| 8,214,508 B2 | | 7/2012 | Masuoka |
| 8,259,432 B2 | | 9/2012 | Sweeney et al. |
| 2003/0041427 A1 | * | 3/2003 | Hattori ............... H01G 4/30 29/25.42 |
| 2004/0071944 A1 | | 4/2004 | Weir et al. |
| 2006/0067033 A1 | | 3/2006 | Mosley |
| 2006/0121349 A1 | | 6/2006 | Chow et al. |
| 2007/0117338 A1 | * | 5/2007 | Yamamoto ............... H01G 4/232 438/396 |
| 2007/0159767 A1 | | 7/2007 | Jamison et al. |
| 2009/0090999 A1 | | 4/2009 | Carver |
| 2009/0207555 A1 | | 8/2009 | Hackenberger et al. |
| 2010/0097740 A1 | | 4/2010 | Yamaguchi |
| 2010/0277852 A1 | | 11/2010 | Kimock et al. |
| 2011/0051313 A1 | * | 3/2011 | Hwang ............... H01G 4/20 361/311 |
| 2011/0051315 A1 | | 3/2011 | Dogan |
| 2011/0059838 A1 | | 3/2011 | Yono et al. |
| 2011/0085281 A1 | | 4/2011 | Yamaguchi |
| 2011/0110015 A1 | * | 5/2011 | Zhang ............... H01G 4/20 361/311 |
| 2011/0110017 A1 | * | 5/2011 | Natsui ............... C01G 23/006 361/321.1 |
| 2011/0223431 A1 | * | 9/2011 | Sakurai ............... B32B 18/00 428/446 |
| 2012/0039017 A1 | | 2/2012 | Baron et al. |

FOREIGN PATENT DOCUMENTS

| | | |
|---|---|---|
| JP | S6144415 A | 3/1986 |
| JP | H01202806 A | 8/1989 |
| JP | 1097834 C | 1/2003 |
| JP | 2005285968 A | 10/2005 |
| JP | 2008227093 A | 9/2008 |
| JP | 2009292671 A | 12/2009 |
| JP | 2010062411 A | 3/2010 |
| JP | 2011029294 A | 2/2011 |

OTHER PUBLICATIONS

CT International Search Report; International Application No. PCT/US2012/064944; Applicant: Martin A. Stuart et al; Date of Actual Completion of International Search: Mar. 22, 2013; Date of Mailing of International Search Report: dated Mar. 25, 2013; Authorized Officer: Han Cheol Joen.

European Patent Office—Supplementary Partial ESR—dated Sep. 15, 2015—Application No. EP 12849600.7—Place of Search: Munich—Date of Completion of Search: Sep. 7, 2015.

\* cited by examiner

| h-BaTiO$_3$ | ~40-240 μ |

| 2 — | DLC | ~1 μ |
| 3 — | Metallic Electrode | ~1 μ |
| 2 — | DLC | ~1 μ |

| 15 — | BaTiO$_3$ Deposited by PLD | ~10-250 μ |
| 16 — | ZnO | ~100 A |
| 17 — | Glass or Metal Carrier | ~250 μ |

FIG. 6

| | | |
|---|---|---|
| | etc | |
| 16 — | ZnO | ~100 A |
| 2 — | DLC | ~1 μ |
| 3 — | Metallic Electrode | ~1 μ |
| 2 — | DLC | ~1 μ |
| 18 — | BaTiO$_3$ Deposited by PLD | ~10 μ |
| 16 — | ZnO | ~100 A |
| 2 — | DLC | ~1 μ |
| 3 — | Metallic Electrode | ~1 μ |
| 2 — | DLC | ~1 μ |
| 17 — | Glass or Metal Carrier | ~250 μ |

FIG. 7

HIGH ENERGY DENSITY STORAGE DEVICE

CROSS-REFERENCES TO RELATED APPLICATIONS

This application is a continuation of U.S. patent application Ser. No. 14/921,199 filed on Oct. 10, 2015, which is a continuation of U.S. patent application Ser. No. 14/357,676, filed on May 12, 2014 and issued as U.S. Pat. No. 9,230,741 granted on Jan. 5, 2016, which is the national stage of International Application No. PCT/US2012/064944 filed on Nov. 14, 2012, which claims the benefit of priority to U.S. Provisional Patent Application No. 61/560,461 filed on Nov. 16, 2011. The entire disclosures thereof are incorporated herein by reference.

BACKGROUND

Capacitors are devices that store electrical energy on a dielectric material between two conductive electrodes, usually metal. Their architecture has followed a path that started as a metal sleeve on the outside and inside of a glass jar (called a Leyden Jar). Today, materials with very high dielectric constants are used in geometries that maximize the area of the electrodes while at the same time providing dielectric thicknesses that result in high breakdown voltages. The combination of high dielectric constant, high voltage, and high electrode surface area leads to an energy storage capability with very high specific energy (energy per unit volume).

Recently it has been reported (U.S. Pat. No. 7,023,687, incorporated herein by reference) that very small particles of Barium Titanate ($BaTiO_3$) coated with a layer of Alumina ($Al_2O_3$) can have very high dielectric constants (values near 20,000) when they are preferentially oriented by an external electric field. The cited inventors have chosen to fill the gaps between the particles with a plastic (the chosen plastic is PET) so as to increase the breakdown voltage of the dielectric layer and to hold the particles in place. This solution uses powdered metal (Aluminum) to create the conducting electrodes. In order to access the increased dielectric constant of the $BaTiO_3$ material, a high voltage is applied to the matrix between the electrodes while the system is held at a temperature high enough for the PET to be soft to allow the $BaTiO_3$ particles to orient. The layer of $BaTiO_3$ particles needs to be relatively thin in order to have a high enough field strength to cause the preferential orientation. One problem has been the fact that most dielectric materials used in this application have a breakdown voltage that is lower than the voltage needed for the orientation effect. The inventors reported that the breakdown voltage can be held just above the required value if the $BaTiO_3$ particles are densely packed in the PET matrix of the dielectric layer.

Even more recent is an application in Japan by the Japanese Aerospace Exploration Agency and TDK (US patent application pub. No. 2011/0059838 for Dielectric Ceramic Composition, incorporated herein by reference). The material in this application is also $BaTiO_3$ made with an additional small amount of Lanthanum, Cerium, Vanadium, or Bismuth. This addition and processing method provides a hexagonal form of $BaTiO_3$ which has a measured dielectric constant of 160,000.

However, there are problems with practical devices based on this architecture using PET. If the $BaTiO_3$ coated particles have a lower density in some areas of the plastic matrix, then a lower breakdown voltage will be experienced in that specific area. This results in local current breakdown with high heating and subsequent destruction of the device. This susceptibility to catastrophic breakdown is further exacerbated by a residual heating effect in the powdered metal electrodes due to a resistance from metal particle to particle, and to a residual heating effect in the $BaTiO_3$ material due to charging and discharging. While this effect may be small, the temperature effect is evident in the charge/discharge operation and important for the life and reliability of the device. These concerns can therefore severely limit the maximum allowed applied voltage to the device and thereby limit the amount of energy storage, limiting the utility of the resulting device.

SUMMARY

Examples of a new method and design is provided that inserts a thin layer of an electrically insulating material with a high breakdown voltage and very good heat conductivity between the electrode and the dielectric material. The insulating material, for example Diamond Like Carbon (DLC), can be deposited in thin layers by a number of different methods described below. The specific thicknesses and the method of deposition can vary depending upon the desired energy density and size of the final device.

In one example embodiment, the reliability of the device can be considerably improved over previous embodiments by encasing the $BaTiO_3$ in a low melting temperature glass (LMG), such as, but not limited to, Mitsui's 380C frit glass (U.S. Pat. No. 6,355,586 incorporated by reference), instead of PET. Then, a thin layer of Diamond Like Carbon (DLC) is deposited on both faces of the dielectric layer prior to applying a thin metal film. The DLC serves the function of increasing to a very high level the breakdown voltage of the sandwich (the breakdown voltage of DLC film can be 10,000 volts/micron assuming at least 70% is in the tetrahedral carbon structure, usually specified as $sp^3$ structure) while providing good heat conductivity. A safe voltage range is chosen, typically at about half the breakdown voltage.

The glass or ceramic can be sintered, fused or melted at a temperature below 400 C. This temperature limit is important since Diamond Like Carbon (DLC) can graphitize at or above this temperature. While the glass is soft, a high voltage is applied to orient the $BaTiO_3/Al_2O_3$ particles and the particles remain oriented as the structure cools.

Other embodiments using different electrode material, different layer thicknesses, and different voltages are possible, some of which are described below. The critical parameters for sizing the High Energy Density Storage Device are: 1) the breakdown voltage of the DLC insulation layers, 2) the maximum applied field allowed by the $BaTiO_3$ to keep its high dielectric constant, and 3) the maximum voltage (DC) that can be practically generated in the external power supply.

Provided is a device for storing energy, comprising: a first insulating layer comprising an electrically insulating material having at least good heat conductivity; a dielectric layer comprising particles dispersed in an electrically insulating material, the particles including $BaTiO_3$; a first conducting electrode layer; a second conducting electrode layer; and a second insulating layer comprising the electrically insulating material having at least good heat conductivity. The dielectric layer is provided between the first conducting electrode layer and the second conducting electrode layer.

Also provided is a device for storing energy, comprising: a plurality of insulating layers each comprising carbon at least partially organized in a diamond-like structure; a plurality of dielectric layers each comprising particles dispersed in an electrically insulating material, the particles including $BaTiO_3$; and a plurality of conducting electrode layers. The plurality of conducting electrode layers are interleaved with the plurality of dielectric layers and the plurality of insulating layers to form an electric capacitor device adapted for storing energy obtained from an electrical voltage source connected to the device.

Further provided is a device for storing energy, comprising: a plurality of insulating layers each comprising carbon at least partially organized in a diamond-like structure acting as an electrical insulator and having at least good heat conducting properties; a plurality of dielectric layers including $BaTiO_3$; and a plurality of conducting electrode layers. The plurality of conducting electrode layers are interleaved with the plurality of dielectric layers and the plurality of insulating layers to form an electric capacitor device adapted for storing energy obtained from an electrical voltage source connected to the device.

Still further provided is a device for storing energy, comprising: a plurality of insulating layers comprising an electrically insulating material having at least good heat conductivity; a plurality of dielectric layers; and a plurality of conducting electrode layers. The plurality of conducting electrode layers are interleaved with the plurality of dielectric layers and the plurality of insulating layers to form an electric capacitor device adapted for storing energy obtained from an electrical voltage source connected to the device. Furthermore, the device is adapted for storing energy at an energy density of greater than 10 kilojoules per cubic centimeter.

Also provided are devices with additional combinations and arrangements of the above features, along with additional example embodiments, some, but not all of which, are described hereinbelow in more detail.

BRIEF DESCRIPTION OF THE DRAWINGS

For a fuller understanding of the nature of the present invention, reference should be made to the following detailed description taken in conjunction with the accompanying drawings.

FIG. 5 shows a schematic of a standalone layer of powdered h-$BaTiO_3$ held in place with a low melting point glass or a plastic matrix.

FIG. 6 shows a schematic of a single layer with metal electrode and $BaTiO_3$ deposited on a glass or metal carrier.

FIG. 7 shows a schematic of a multilayer structure created by PLD for low voltage/high capacitance applications.

DETAILED DESCRIPTION OF EXAMPLE EMBODIMENTS

Note that throughout this document, the term DLC is used to describe diamond-like-carbon, a material that may come in various forms, all comprising carbon that displays properties similar to those of diamond, like hardness giving good wear properties, slickness, and that can have high electrical insulation capability, while also having good to excellent heat conducting capability, such as the thermal conductivities in the range of metals (in the tens to many hundreds of W/m-K), to the excellent thermal conductivity of pure diamond (around 1000 W/m-K). However, some forms of DLC may even have semiconductor properties. This DLC material typically includes carbon at least partially organized in a diamond-like structure, and may contain significant amounts of $sp^a$ hybridized carbon atoms. Unlike pure diamond, DLC materials can be made flexible and amorphous. In some of its forms, DLC material may contain actual synthetic diamond material. For the purposes of this disclosure, DLC formulations are preferred that offer high electrical insulating capabilities while also having good to excellent heat conducting capabilities. Other materials having similar properties, such as diamond composites and diamond powders, among others (such as specialized polymers or ceramics that may include diamond-like or actual diamond materials), could be substituted for the DLC material described below.

Figure 1:
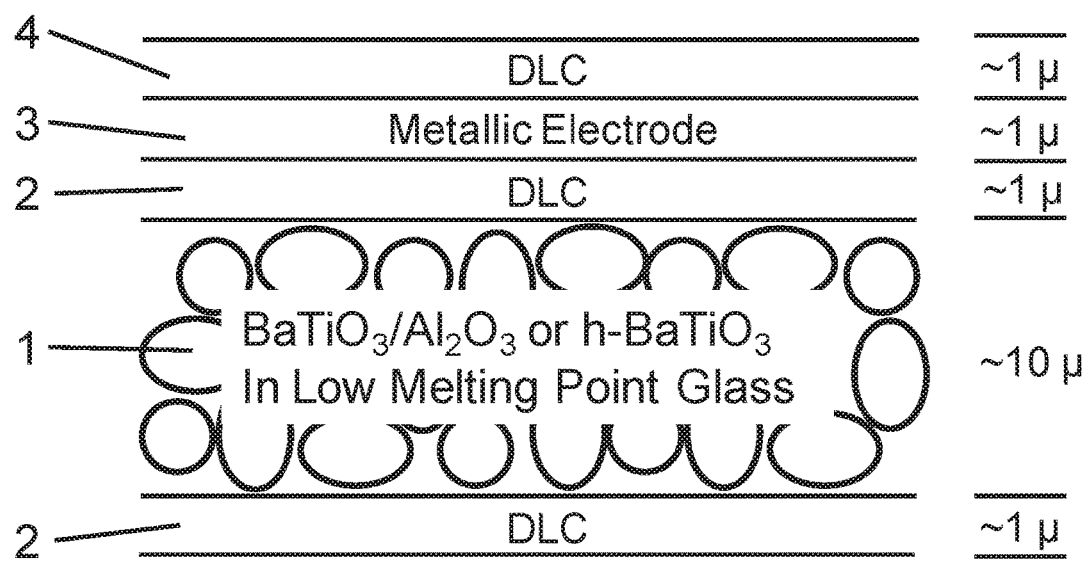
FIG. 1 shows a schematic of an example sandwich structure of the $BaTiO_3/A_2O_3$ or h-$BaTiO_3$ particles in a low melting point glass between layers of Diamond Like Carbon (DLC) with single electrode.

FIG. 1 shows a schematic of the layered structure of an example storage device having a $BaTiO_3$ layer structure 1 with $BaTiO_3/Al_2O_3$ or h-$BaTiO_3$ particles dispersed in an insulating matrix, such as a low melting point glass (where h-$BaTiO_3$ is in the hexagonal structure and has higher dielectric properties than the more common cubic structure). The $BaTiO_3$ layer 1 is coated on top and bottom by a layer 2 of DLC. A metal electrode 3 is deposited on the top DLC layer 2. Multiples of the layers shown in FIG. 1 are sandwiched together in the final storage device as desired to obtain the preferred storage capacity (see, e.g., FIG. 8 and accompanying discussion). The outermost metal electrode layer 3 is coated with an external DLC layer 4 to electrically insulate the storage device. The thicknesses of the layers can be varied as needed, and thus illustrate only one embodiment of this device, in particular where the applied voltages are limited to be below 20,000 volts. This limitation is set by the thickness of the DLC layers between electrodes. By varying the thickness of the DLC layers between the electrodes, the limiting voltage can be changed up or down, with increasing voltages leading to thicker DLC layers.

Although Aluminum particles for the electrode can be used, as in previous approaches, the current carrying capacity of the metal electrode film can be increased for applications with rapid charge/discharge cycles by adding or exclusively using Molybdenum, especially where the film thickness is critical, since Molybdenum has a very low expansion coefficient. In a large cross section device, this would be desirable to reduce the effect of expansion in the metal of the electrode. Alternatively, an alloy of Ni and Fe can be used to match the expansion coefficient of the Low Melting Point glass and/or the DLC by altering the ratio of Ni to Fe to obtain the desired result. Since the entire device can be encapsulated in DLC or another sealing coating, the electrode can be protected from the effects of oxidation that otherwise might preclude the use of such an alloy.

Another alternative candidate for the metal electrode would be to use a coating of copper onto the DLC coated h-BaTiO$_3$ layer, at an elevated temperature up to 400 C. If processed at this temperature, the copper layer upon cool down to ambient temperatures would contract. This permits the use of metal with higher expansion ratios than the composite of h-BaTiO$_3$/DLC layer. This method would permit the use of lower cost metals within the storage device, because the higher Coefficient of Thermal Expansion (CTE) metal would shrink within a cavity inside the DLC encapsulation mentioned. This is an expansion contraction fabrication method. Additionally this method relies on the DLC releasing from the metal it encapsulates. To facilitate this effect there may be an atom-thick release layer similar to, but reverse from, the ZnO layer mentioned in FIG. 6 to facilitate hexagonal crystal formation.

Another alternative for the metal electrode is to use a commercial variation of 430 stainless steel as a substrate which can be obtained at 1 mil thickness (without a custom fixture) or less (with holding fixture). This material in foil form would permit roll-to-roll fabrication as the Coefficient of Thermal Expansion (CTE) is close to that of the h-BaTiO$_3$ dielectric. In this case, the BaTiO$_3$ would be deposited and grown in the h-BaTiO$_3$ form via a suitable hexagonal seed layer, such as Zinc Oxide. This would be followed by a heat and cool down at a proscribed rate. This process would have the advantage of allowing for a more robust metal, during set up, in the roll-to-roll coater. Alternatively, if desired, Titanium or Molybdenum foil could be used in this arrangement as well.

Figure 8:
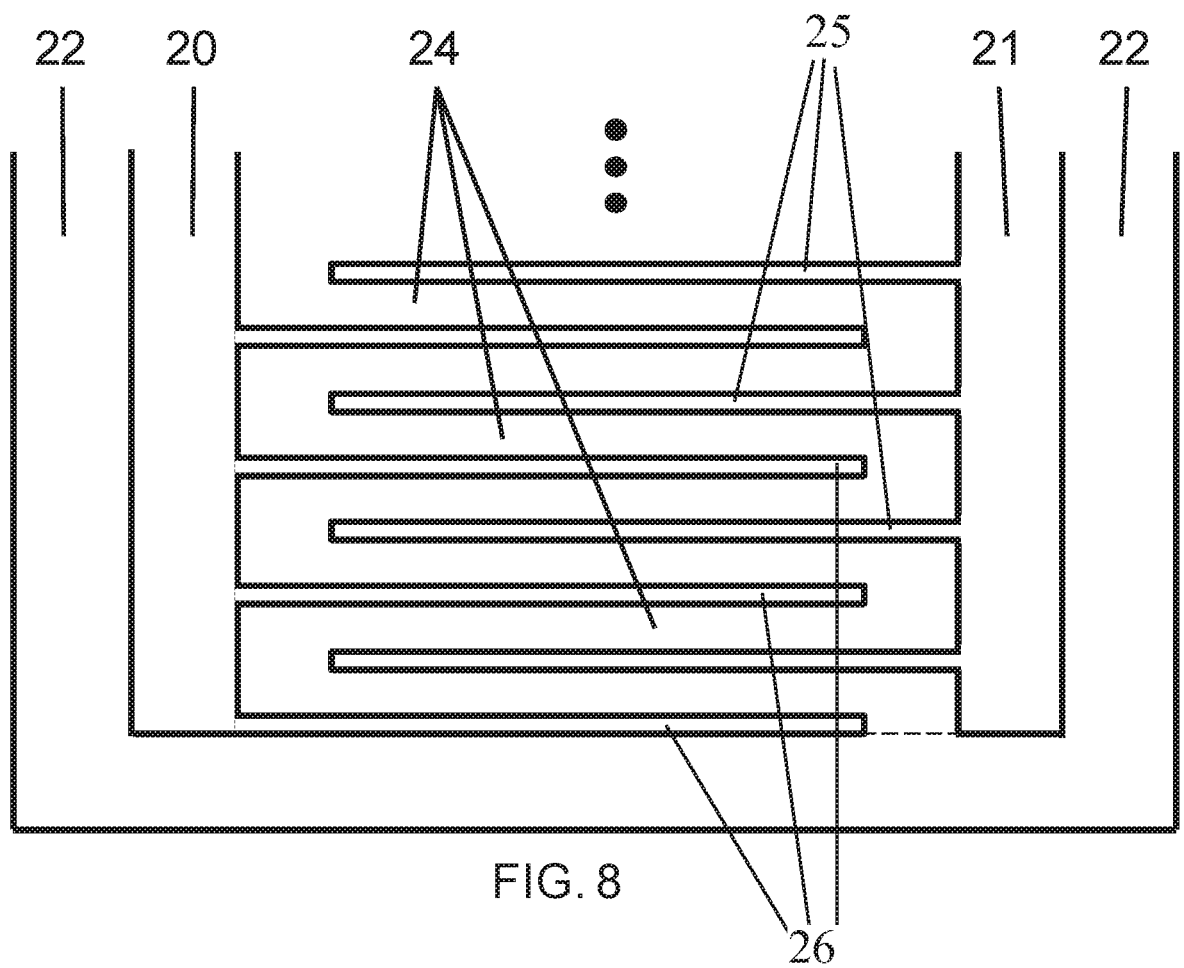
FIG. 8 shows a schematic of the interleaving layers of the electrodes for the complete device.

The electrodes of the full device are typically interleaved, with alternating electrode layers connected to opposite ends of the device (as shown in FIG. 8). One advantage of this construction with layers of DLC is that the very high heat conductivity of diamond will allow the residual heat load in the device to be conducted efficiently to the sides (90 degrees from the electrode ends) where it can be removed by any number of heat transfer methods. For example, assuming two-1 micron DLC layers adjacent to a 10 micron h-BaTiO$_3$ or BaTiO$_3$—Al$_2$O$_3$ particle layer, and a 1 micron thick electrode layer as shown in FIG. 1, the cross section of the side of the device would have a 15% surface area of DLC for conducting heat.

While specific film thicknesses are shown in the figure, they are only illustrative of the various choices a designer could make. The thickness of the DLC layer is related to the maximum desired voltage of the device. Lower voltages would permit the choice of thinner DLC layers, and, indeed, any of the layers could be changed by the designer to tailor a device for specific tasks and applications. For fabrication of thick DLC layers, trace amounts of various metals, such as Titanium, Tungsten, Cobalt, or various others mixed with carbon in low percentages, can be used to create a stress relieve layer. Additionally, lowering the radiance levels of the laser on the pure carbon target will create sp$^2$ (graphite) layers which are also stress relief layers. Stress relief is desired for thick layers to prevent cracking.

The manufacture of these layered storage devices can be accomplished via the use of several standard technologies. The preferred method is high speed Pulsed Laser Deposition (PLD) which can be accomplished in a roll-to-roll coater. Magnetron sputtering in a roll-to-roll Chemical Vapor Deposition (CVD) coater would also be a viable method, as would planar CVD, reactive CVD or Plasma Assisted Chemical Vapor Deposition (PACVD). These deposition methods are existing art and are used for other applications, but can be applied to manufacture the disclosed devices.

When using PLD to manufacture the device, any of several pulsed lasers can be used. These include the Neodymium doped Yttrium Aluminum Garnet (Nd:YAG), the Neodymium doped Yttrium Vanadate (Nd:YbVO$_4$), the Chromium doped Alexandrite (Cr:BeAl$_2$O$_4$), or the Titanium doped Sapphire lasers. Other lasers can also be used, in particular if they are pulsed and have high power density in the focused spot. For high growth rates, this process best utilizes lasers exhibiting both high radiance per pulse and high average power. Lasers in this class are usually considered military systems. The laser is focused on a high purity carbon target with an energy density in the range $10^8$ to $10^{10}$ (or more) Watts per square centimeter. This energy density is desired to create a plume of single carbon ions (lower energies tend to create clusters or strings of carbon atoms). The desired pulse width would be in the range of tens of nanoseconds, which is a usual pulse length for Q-switched lasers (or down to the picosecond range if they are mode locked). The pulse repetition rate will be function of which laser gain material is actually used, and is usually in the range of several to several tens of kilohertz for the Q-switched systems. This method is existing art, although the growth rate for the DLC is fairly slow.

Several methods are proposed herein to increase the growth rate and the quality of the Diamond Like Carbon surface. At high PLD growth rates, one of the problems is that clusters of carbon atoms that are not in the sp$^3$ diamond structure impinge on the substrate. To improve the quality and rate of growth of the PLD films, the carbon plume is confined and directed to the substrate by several possible methods, the simplest of which is electrostatically charged baffles or electrodes. Additional methods would include using a quadrupole antenna or radio frequency (RF) antenna. The use of RF frequency (for example in the Microwave frequency range to couple to the carbon-carbon bond) can both serve to focus the beam and to break up any clumps of carbon atoms within the ejected material. A third alternate method is to use a portion of the laser beam in a second beam path to irradiate the plume in flight. This second beam can be at the primary frequency or at a harmonically converted frequency (or combination of both) of the source laser.

In the architecture described in FIG. 1, a completed envisioned device could have 10,000 or more layers per foot of height, with the length, from centerline assumed, but not limited to, 6 inches and the width from heat sink to heat sink assumed, but not limited to, 1.5 inches. Such a device would have very high energy density. For example, with a dielectric constant for BaTiO$_3$ of 160,000 as reported for one composition compared to 20,000 reported for another composition, and an applied voltage of 5,000 volts, the device will hold up to ~$2.8 \times 10^9$ Joules (this is ~3 Gigajoules or about 775 kilowatt-hours) of energy in a cubic foot of material.

Figure 2:
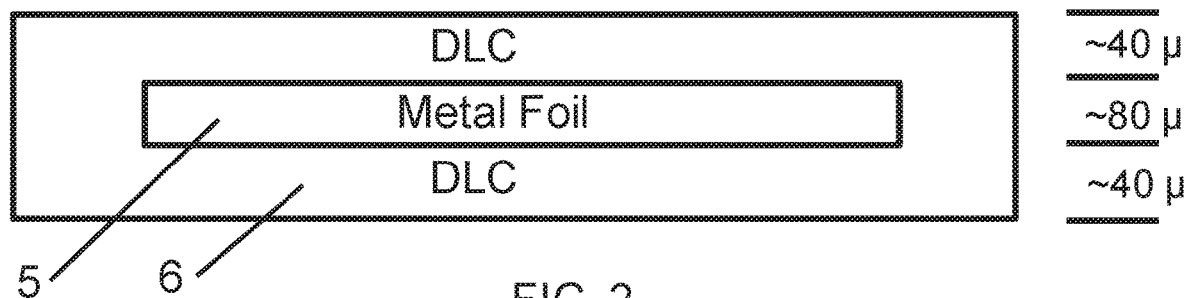
FIG. 2 shows a schematic of an example of thin metal foil coated with DLC.

There are two major alternative construction techniques described below. The first (shown in FIGS. 2-5) is based on a coated insulated electrode built upon a metal foil that is expansion matched to DLC or CTE contraction encapsulation fabricated method. A schematic of this electrode is shown in FIG. 2. A metal foil strip 5 which is as wide as the Energy Storage Unit (ESU) device is coated on both sides and edges and one end by a layer of DLC 6. For this example, the metal foil 5 is 2 mils thick or less, the desired value being the minimum practical thickness. The DLC layer 6 is between 1/40 mil and 1 mil in thickness, the desired value being determined by the maximum applied voltage.

Figure 3:
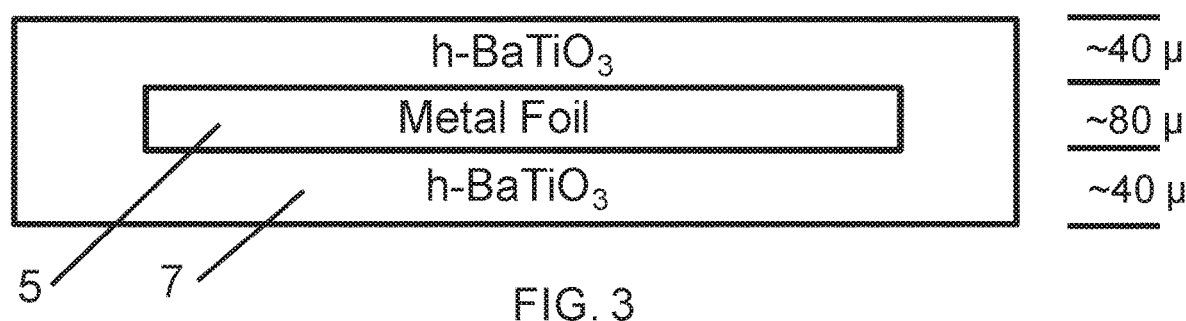
FIG. 3 shows a schematic of an example of metal foil with matched thermal expansion coefficient completely encased in h-$BaTiO_3$ and sintered glass.
Figure 4:
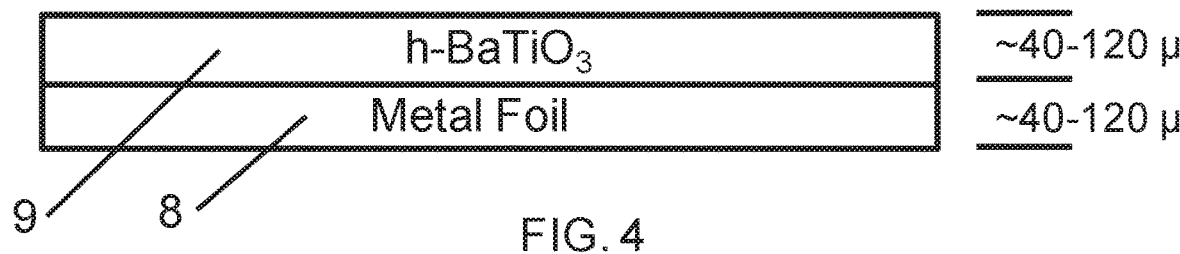
FIG. 4 shows a schematic of an example with metal foil coated on only one side with h-$BaTiO_3$ and sintered glass.

FIGS. 3-5 show three alternative ways to add layers of BaTiO$_3$ to the electrode in FIG. 2 to form the ESU structure. In each case, the BaTiO$_3$ layer is interleaved with the metal foil electrode in FIG. 2 to create the multi-layered capacitor that is the ESU.

The hexagonal or doped formulation of BaTiO$_3$ can also be a powder that is mechanically added to an interleaved structure of DLC on metal electrode similar to that shown in FIG. 2. This design variant has the advantage of particle self-alignment after construction. This version would have the advantage of the simplest construction lending itself to automated assembly.

Figure 2A:
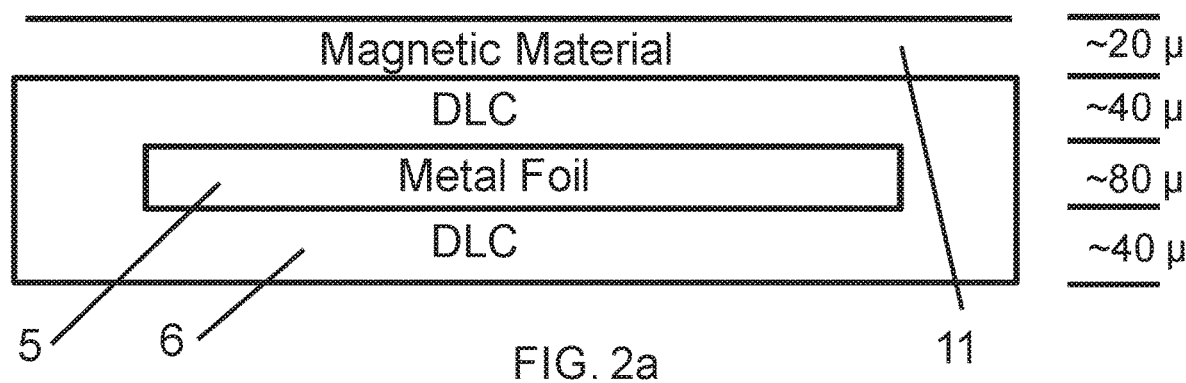
FIG. 2a shows a schematic similar to FIG. 2 with the addition of a layer of magnetic material.

An additional variation of the electrode shown in FIG. 2a is to add a layer of high magneto-coercive material 11 on the outside of the DLC layer, such that the current flow through the electrode will set up a magnetically opposed force. This will have the effect of slowing the current and thus limiting the discharge rate. This would be desirable for situations in consumer applications such as hybrid car power cells, where for safety reasons a designer would want to limit the short circuit current in crashes and/or power system malfunctions.

In FIG. 3, a carrier metal strip 5 (for example, the commercially available nickel-cobalt ferrous alloy of Kovar® or the nickel-iron alloy Invar®) for which the coefficient of thermal expansion is matched to that of BaTiO$_3$ in sintered glass is coated on both sides. The dimensions are approximate. The coating material 7 is powdered h-BaTiO$_3$ mixed with glass particles which are ultimately sintered or hot pressed to form a layer. The metal foil 5 is from 1 to 3 mils thick, and the BaTiO$_3$ layers 7 can range from ¼ to 40 mil in thickness depending upon the desired energy density.

In FIG. 4, the carrier metal strip 8, similar to FIG. 3, is coated on only one side 9 with BaTiO$_3$. Here the layers are from 1 to 3 mils thick, with the dimension of the electrode 8 as thin as is practical.

Finally, the BaTiO$_3$ layer may be self supporting with no metal substrate when it is made up of particles suspended in a low melting point glass or in a plastic matrix or just mechanically applied to interleaved structures. This example is shown in the schematic of FIG. 5. The thickness of the BaTiO$_3$ layer 10 is determined by what is practical based on the machinery used. As will be shown below, the desired thickness depends upon the applied voltage and the desired energy density. All of the example configurations shown in FIGS. 3-5 are provided sandwiched between electrodes as shown in FIG. 2 in making the ESU device.

Additional alternate constructions are shown in FIGS. 6 and 7. These constructions are based on the ability to create layers using Pulsed Laser Deposition (PLD). In each case, a carrier (either a boron-silicate glass, e.g., about 2 mils thick, or a metal layer of matched thermal expansion to BaTiO$_3$ such as Kovar or an iron/nickel mix) is coated with various layers deposited using PLD.

In the example of FIG. 6, the substrate 17 is first coated with a very thin layer 16 of Zinc Oxide (ZnO). This layer need only be thick enough to establish a crystalline structure, as small as a few tens of angstroms. This layer is desired so that the BaTiO$_3$ structure 15 that is grown next has the preferred hexagonal structure with the desired z-axis perpendicular to the surface. This aligns the axis of the high dielectric constant with the axis of the ESU. Next, a layer of DLC 2 is deposited with a thickness, e.g., at least 1 micron (¹⁄₂₅ mil). Next is provided a layer of metal 3 that serves as an electrode which is then coated by another layer 2 of DLC. The DLC on both sides of the metal electrode serves the purpose of providing a good insulation barrier to prevent current from flowing even at very high applied voltages. The ESU is ultimately assembled by interleaving multiple structures where the carrier may or may not be removed.

FIG. 7 shows another example arrangement having a monolithic structure created using PLD that is similar to devices created for integrated circuits. On a metal or glass carrier 17, alternating layers 2 of DLC and metallic electrode 3 are sandwiched between layers 18 of BaTiO$_3$ grown on Zinc Oxide coated substrates 16. The full size structure would contain an even number of BaTiO$_3$ layers, with the limit only imposed by practical considerations for the number of PLD layers possible without opening the vacuum chamber. Once a multi layer structure is made, many of them can be sandwiched together to form the full ESU.

These example alternate structures for the ESU are 1) based on the high dielectric constant of BaTiO$_3$ or one of its doped derivatives, and 2) use the insulating and thermal properties of DLC. There are a number of variations within these general principles for the exact thicknesses of any of the layers, and even the ordering and number of intermediate layers. The exact details will be governed by the practicality of the various mechanical implementations, and the methodology is not limited to any one specific design.

FIG. 8 shows schematically an example of how the electrodes of the example energy storage devices can be interleaved. The left electrode 20 has comb-like fingers 26 of layers that are interleaved with the fingers 25 of the right electrode 21. The material between the electrodes 24 can be any of the example layers of materials deposited on the metallic electrodes or metal foils shown in FIGS. 1-6. The total number of layers is arbitrary. The final device is encapsulated in a jacket 22 of DLC, which can serve as an electrical insulator and, if necessary for large devices, a thermal path to a cooling system.

Figure 9:
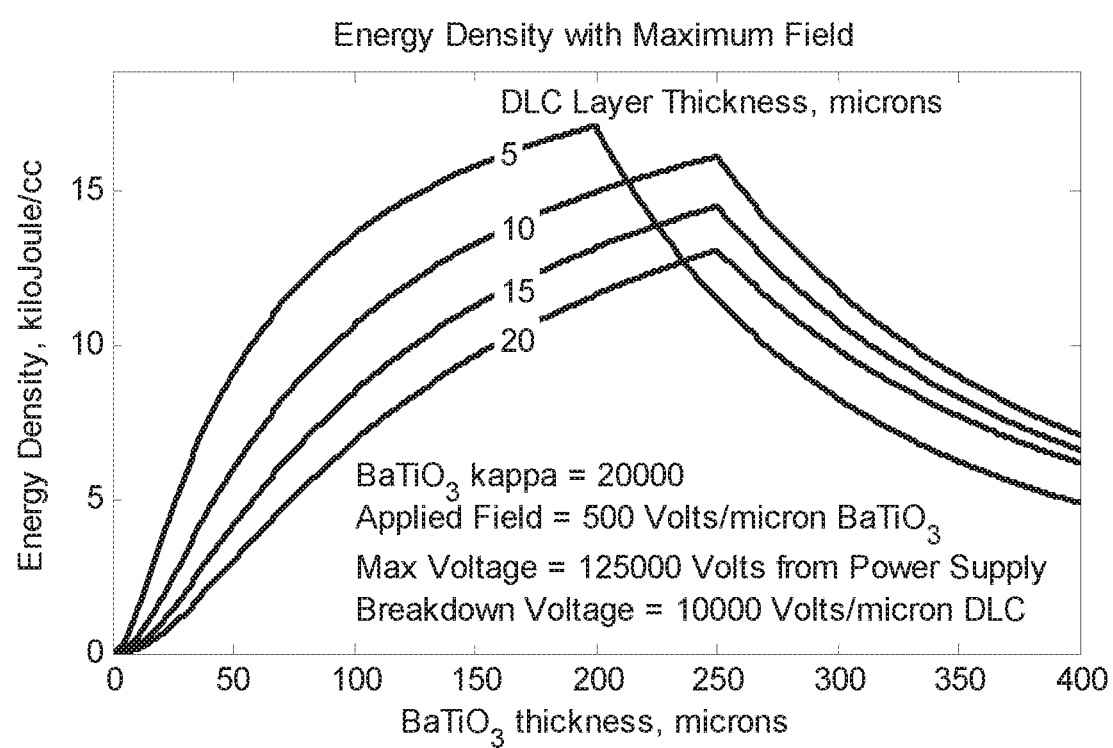
FIG. 9 is a plot showing the energy density of an example embodiment where all applied voltages are at their limiting value.

FIG. 9 shows a plot of the energy density values that are possible for various thicknesses of BaTiO$_3$ and DLC layers for some of the example embodiments. In each case, the electrode thickness is assumed to be about 25 microns. The plots assume the lower value of the dielectric constant for BaTiO$_3$ from the previous compositions of 20,000. The maximum applied field across the BaTiO$_3$ is limited to about 500 Volts per micron based on data showing that the dielectric constant is virtually unchanged up to fields of this strength. The breakdown voltage for the DLC is assumed to be 10,000 Volts per micron, which is appropriate for the sp$^3$ (diamond) structure. The BaTiO$_3$ layer is not assumed to add any protection against voltage breakdown. Finally, the maximum voltage available from the external power supply is assumed to be limited to about 125,000 Volts for this example. The figure shows the energy density in kilojoules per cubic centimeter for four different thicknesses of DLC and as the thickness of the BaTiO$_3$ increases up to about 254 microns (10 mils).

The curves in FIG. 9 show the energy per cubic centimeter (cc) imposed by the above chosen voltage limits. For thicknesses of BaTiO$_3$ below about 200 microns, the maximum energy density per cc is determined by the applied field limitation of 500 Volts per micron of BaTiO$_3$. For thicknesses of BaTiO$_3$ above 250 microns, the energy density per cc is limited by the maximum possible applied voltage of about 125,000 volts. For the case where the DLC layer thickness is 5 microns, the limit is determined by the breakdown voltage of the DLC of 10,000 Volts per micron. This figure shows that the specific choice of these design parameters depends upon the ultimate desired energy density and the ease of manufacturing the layers of certain thicknesses. For a large range of variables, the energy density has the very high value in the range of about 10 kilojoules per cubic centimeter.

Figure 10:
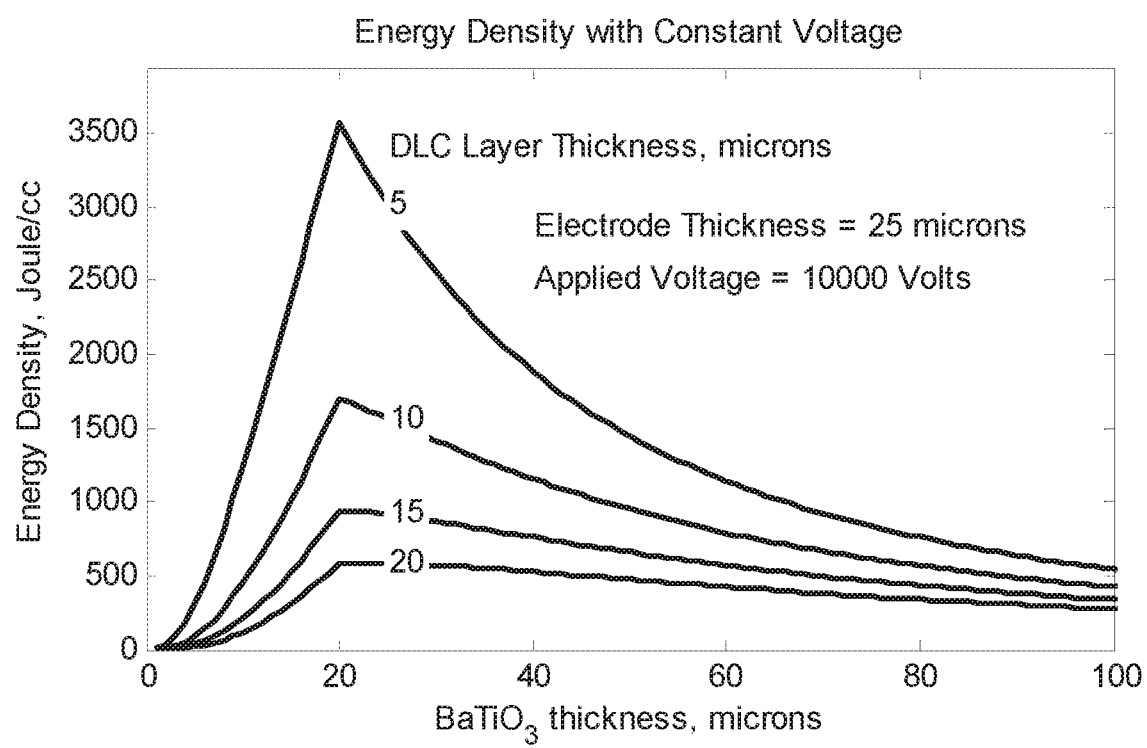
FIG. 10 is a plot showing the energy density in a cubic centimeter for the example energy storage device for the case that the external voltage is limited to 10,000 volts.

The curves in the plot of FIG. 10 show the example design for the case where the maximum applied voltage is limited to about 10,000 volts. For layers thinner than about 20 microns, the voltage is limited by the applied field limitation of 500 Volts per micron. For layers thicker than about 20 microns, the energy density decreases because the applied voltage is constant and the capacitance decreases since it is inversely related to the thickness between electrodes. As the layers get thinner the number of layers that are needed to create a 1 cm thick stack becomes very large. So, again, there is a tradeoff between ease of manufacturing, thicknesses of layers, applied voltage, and energy density.

Example Applications

The energy densities obtained with the device described herein exceed by a factor greater than 5 the energy density of Lithium-Ion batteries of existing technologies. Furthermore, the device can typically be more rapidly charged, and won't degrade in the manner often seen in rechargeable batteries, and thus may need be replaced less often. The device also typically has less internal current leakage, and thus stays charged longer. The resulting improved device can then be utilized for applications where high-energy density mobile power sources are desired. For example, such a device can be used to power an electric automobile, aircraft, ship, or other transportation device, effectively replacing storage batteries with a more energy-dense, and less environmentally toxic, solution. Furthermore, the dense energy storage will allow for more compact and mobile use of devices requiring large amounts of energy, such as for powering mobile LASERs, electromagnetic weapons (e.g., rail guns), and other such devices.

In addition, the energy storage device could be utilized in arrays of devices for energy storage on a large scale, such as for storing wind or solar electrical energy during peak generation for use at other times when the wind or sun are not available. Also, applications include systems that involve long unattended operational lifetimes, such as powering remote sensors, micro space satellites, or even deep space probes, or systems where recharging capability may be infrequent.

Also, the device can be used on a small scale as a replacement in any device using batteries. This includes portable devices ranging in any size from flashlights to computers, cell phones, and watches. This concept taken to miniature extremes would have all of these features on an integrated circuit in a nano robotic application. One such example would be for a covert listening or locating device about the size of a grain of salt.

Many other example embodiments of the invention can be provided through various combinations of the above described features. Although the invention has been described hereinabove using specific examples and embodiments, it will be understood by those skilled in the art that various alternatives may be used and equivalents may be substituted for elements and/or steps described herein, without necessarily deviating from the intended scope of the invention. Modifications may be necessary to adapt the invention to a particular situation or to particular needs without departing from the intended scope of the invention. It is intended that the invention not be limited to the particular implementations and embodiments described herein, but that the claims be given their broadest reasonable interpretation to cover all novel and non-obvious embodiments, literal or equivalent, disclosed or not, covered thereby.

What is claimed is:

1. A method for manufacturing a device for storing electrical energy, said method comprising steps of: providing a first conducting electrode layer; providing a second conducting electrode layer; providing a dielectric layer; depositing an electrically insulating layer comprising carbon on either a surface of the dielectric layer, or a surface of the first conducting electrode layer; depositing another electrically insulating layer either on another surface of the dielectric layer or a surface of the second conducting electrode layer; and configuring said conducting electrode layer and said dielectric layer such that said insulating layers electrically insulate said conducting layers from said dielectric layer provided between said conducting electrode layers; said device k configured for storing energy at an energy density of about 10 kilojoules per cubic centimeter or more.

2. The method of claim 1, wherein said dielectric layer is comprised of particles including $BaTiO_3$.

3. The method of claim 2, wherein said dielectric layer also includes $Al_2O_3$.

4. The method of claim 2, wherein the $BaTiO_3$ of said particles is at least partially organized in a hexagonal structure.

5. The method of claim 1, wherein the carbon in the insulating layers is at least partially organized in a diamond-like structure.

6. The method of claim 1, wherein the carbon in the insulating layer is at least partially organized as diamond.

7. The method of claim 1, wherein said insulating layer is about 1 micron thick or less.

8. The method of claim 1, wherein said conducting layer includes a material having a coefficient of thermal expansion that is close to that of the dielectric layer.

9. The method of claim 1, further comprising the step of providing a layer including a high magneto-coercive material.

10. The method of claim 1, further comprising the step of providing a layer including zinc oxide.

11. The method of claim 1, further comprising the step of staggering a plurality of said conducting electrode layers and a plurality of dielectric layers such that each dielectric layer is sandwiched between opposing conducting layers wherein each conducting layer has an associated one of said insulating layers between the respective conducting layer and the adjacent dielectric layer.

12. The method of claim 11, wherein an insulating layer is provided on each side of the conducting electrode layers.

13. The method of claim 1, wherein said dielectric layer has a dielectric constant that is about 20,000 or more.

14. The method of claim 1, wherein said conducting electrode layer is provided by a vapor deposition process.

15. The method of claim 1, wherein said conducting electrode layer is provided as a thin conducting metallic foil.

16. The method of claim 1, wherein said insulating layer is deposited using a vapor deposition process.

17. The method of claim 1, wherein said dielectric layer is provided by a vapor deposition process.

18. A method for manufacturing a device for storing electrical energy, said method comprising steps of: providing a first conducting electrode layer; providing a second conducting electrode layer; providing a dielectric layer; depositing, using a vapor deposition process, an electrically insulating layer comprising carbon formed into a diamond or diamond-like structure on either a surface of the dielectric layer or a surface of the first conducting electrode layer; depositing another electrically insulating layer either on another surface of the dielectric layer or a surface of the second conducting electrode layer, wherein said conducting electrode layer and said dielectric layer are configured such that said insulating layers electrically insulates said first and second conducting layers from said dielectric layer; said device is configured for storing energy at an energy density of about 10 kilojoules per cubic centimeter or more.

19. A method for manufacturing a device for storing electrical energy, said method comprising steps of: providing a plurality of conducting electrode layers; providing a plurality of dielectric layers; depositing an electrically insulating layer comprising carbon formed into a diamond or diamond-like structure on either a surface of each dielectric layer and/or a surface of each conducting layer such that an electrically insulating layer is provided between each conducting electrode layer and any adjacent dielectric layer to electrically insulate each conducting electrode layers from any adjacent dielectric layers, wherein the plurality of conducting electrode layers and said plurality of dielectric layers are arranged such that each dielectric layer is sandwiched between two different ones of said conducting electrode layers, and wherein at least one insulating layer is provided on a side of at least one conducting electrode layer that is not facing at least one dielectric layer adjacent to the at least one conducting electrode layer; said device is configured for storing energy at an energy density of about 10 kilojoules per cubic centimeter or more.

\* \* \* \* \*